US007105255B2

(12) United States Patent
Lin

(10) Patent No.: US 7,105,255 B2
(45) Date of Patent: Sep. 12, 2006

(54) EUV REFLECTION MASK AND LITHOGRAPHIC PROCESS USING THE SAME

(75) Inventor: Benjamin Szu-Min Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 233 days.

(21) Appl. No.: 10/428,688

(22) Filed: May 1, 2003

(65) Prior Publication Data

US 2004/0219437 A1    Nov. 4, 2004

(51) Int. Cl.
*G01F 9/00*    (2006.01)
(52) U.S. Cl. ............................................. 430/5
(58) Field of Classification Search ................ 430/5, 430/22; 378/34, 35
See application file for complete search history.

(56) References Cited

U.S. PATENT DOCUMENTS

| 5,572,564 A | * | 11/1996 | Murakami ............... 378/35 |
| 6,150,060 A | * | 11/2000 | Vernon ................... 430/5 |
| 2004/0188627 A1 | * | 9/2004 | Panning .................. 250/372 |

* cited by examiner

*Primary Examiner*—S. Rosasco
(74) *Attorney, Agent, or Firm*—J.C. Patents

(57) ABSTRACT

An invention of lithography process using an improved reflection mask is provided for extreme ultraviolet (EUV) lithography. In the process an incident EUV is transmitted onto the reflection mask at a grazing incident angle. Therefore a reflected EUV develops a pattern image to a photo resist layer on the surface of the wafer, wherein the shape of the pattern image is dependent on the shape of a plurality of reflective regions on the surface of the reflection mask. Specially, the improved reflection mask is more easily fabricated. The surface roughness and the defects of the reflection mask are also more easily controlled. The improved EUV lithography process is more efficient and cheap.

19 Claims, 5 Drawing Sheets

EUV REFLECTION MASK AND LITHOGRAPHIC PROCESS USING THE SAME

BACKGROUND OF THE INVENTION

1. Field of Invention

The present invention relates to an extreme ultraviolet (EUV) mask and a lithographic process using the EUV mask. More particularly, the present invention relates to an EUV mask and an EUV lithographic process using the EUV mask at a grazing incident angle of an EUV source.

2. Description of Related Art

In an EUV lithographic process of a prior art, a multilayer reflection mask is used for developing the patterns to the wafers. FIG. 1 illustrates a structure of a multilayer reflection mask 110 of the prior art. The multilayer reflection mask 110 in FIG. 1 includes a silicon or glass substrate 102 and a reflective multilayer film 104 is formed on the substrate 102. The reflective multilayer film 104 includes forty pairs of molybdenum and silicon, wherein the molybdenum layers are each about 3 nm thick and the silicon layers are each about 4 nm thick. A capping layer 106 including an amorphous silicon layer having a thickness of about 7 nm is formed on the reflective multilayer film 104 to protect the reflective multilayer film 104 from oxidation. Finally an absorbing layer 108 including silicon oxide or silicon nitride is formed on the capping layer 106.

FIG. 2 illustrates the process of EUV lithography of the prior art. In FIG. 2 an incident EUV 204 emitted from an EUV source 202 irradiates on the surface of the multilayer reflection mask 110 at an incident angle 206. The incident angle 206 denotes the angle between an incident direction of the incident EUV 204 and the surface paralleled to the capping layer 106 or the absorbing layer 108. A portion of the incident EUV 204 irradiating on the capping layer 106 is reflected with high reflectivity in a range of about 70% to about 80%, and the other portion of the incident EUV 204 irradiating on the absorbing layer 108 is absorbed with high absorption of about 90% or more. Therefore, about 70% to about 80% of the incident EUV 204 is transferred into a highly-reflected EUV 208 and about 10% or less of the incident EUV 204 is transferred into a lowly-reflected EUV 210. The reflected EUV 212 including the highly-reflected EUV 208 and the lowly-reflected EUV 210 is transmitted onto a photo resist layer 214 on the surface of the wafer 216. Therefore the patterns on the surface of the multilayer reflection mask 110 are developed to the surface of the wafer 216 by the highly-reflected EUV 208.

In order to achieve high reflectivity on the reflective multilayer film 104, the incident angle 206 is set in a range of about 80 degree to about 89 degree, that means the incident of the EUV is nearly normal. The individual thin film thickness of the reflective multilayer film 104 are preferably controlled tightly to be within their target thickness ±0.1 nm, in order to ensure constructive interference between the layers to achieve a high reflectivity of about 70% or more. The surface roughness of the substrate 102 is also controlled tightly to be within its target thickness ±0.1 nm. And if defects 112 are formed in the process of forming the reflective multilayer film 104, a lot of the defects 112 are not repairable. When all the limitations are tightly controlled, the final reflectivity of the surface of the mask is in a range of about 70% to about 80%. Consequently, in the prior art, it is hard to fabricate a smooth, defect-free and highly reflective EUV multilayer reflection mask.

SUMMARY OF THE INVENTION

The invention provides an EUV mask for an EUV lithographic process. As embodied and broadly described herein, the invention provides an easily fabricated structure of an EUV mask. An incident EUV is transmitted onto the EUV mask at a grazing incident angle. The EUV mask includes a portion of reflective regions on the surface of the EUV mask for reflecting the incident EUV with high reflectivity and another portion of absorbing regions on the surface of the EUV mask for absorbing the incident EUV with high absorption. The reflected EUV develops a pattern image to a photo resist layer on the surface of the wafer, wherein the shape of the pattern image is dependent on the shape of the reflective regions on the surface of the EUV mask. Specially, the improved EUV mask includes fewer layers and is easily fabricated. The surface roughness and the defects of the EUV mask are more easily controlled compared with the prior art. The improved EUV lithographic process is efficiently and cheap.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
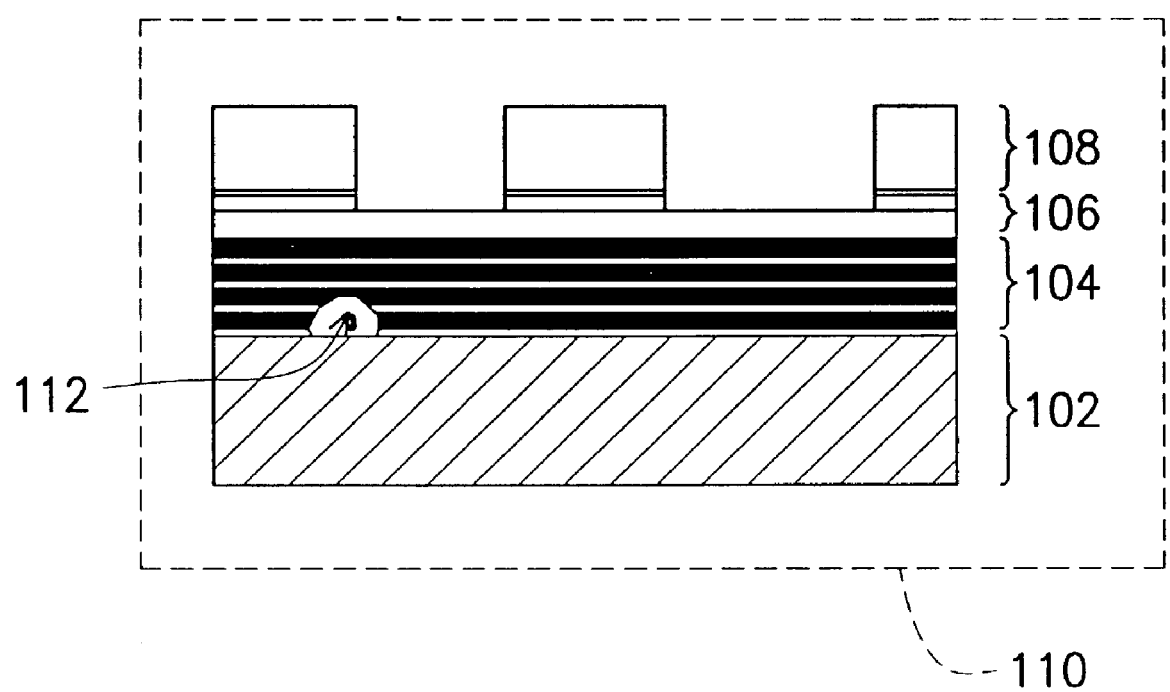
FIG. 1 illustrates a structure of a multilayer reflection mask of a prior art.
Figure 2:
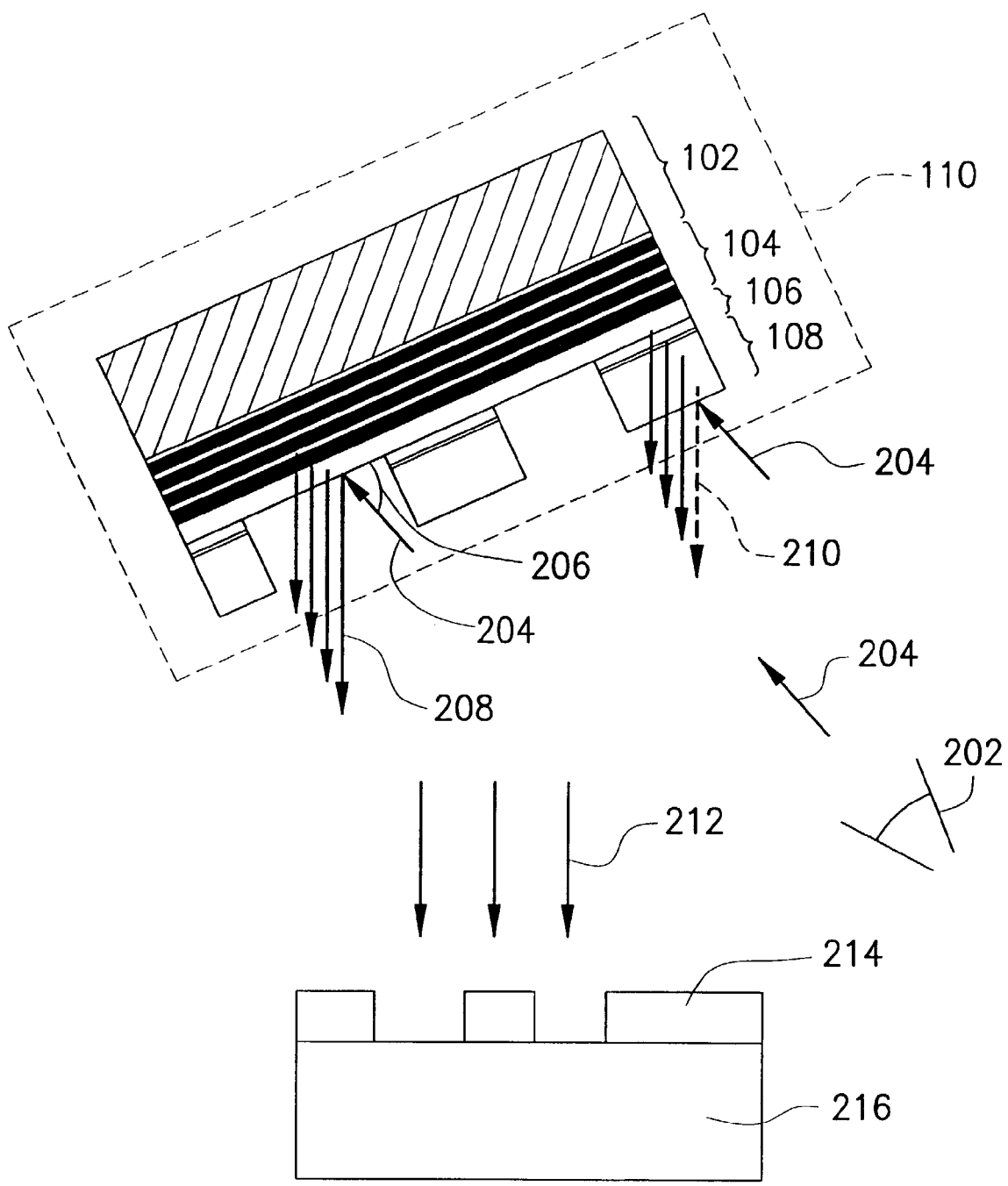
FIG. 2 illustrates a process of EUV lithography of a prior art.
Figure 3:
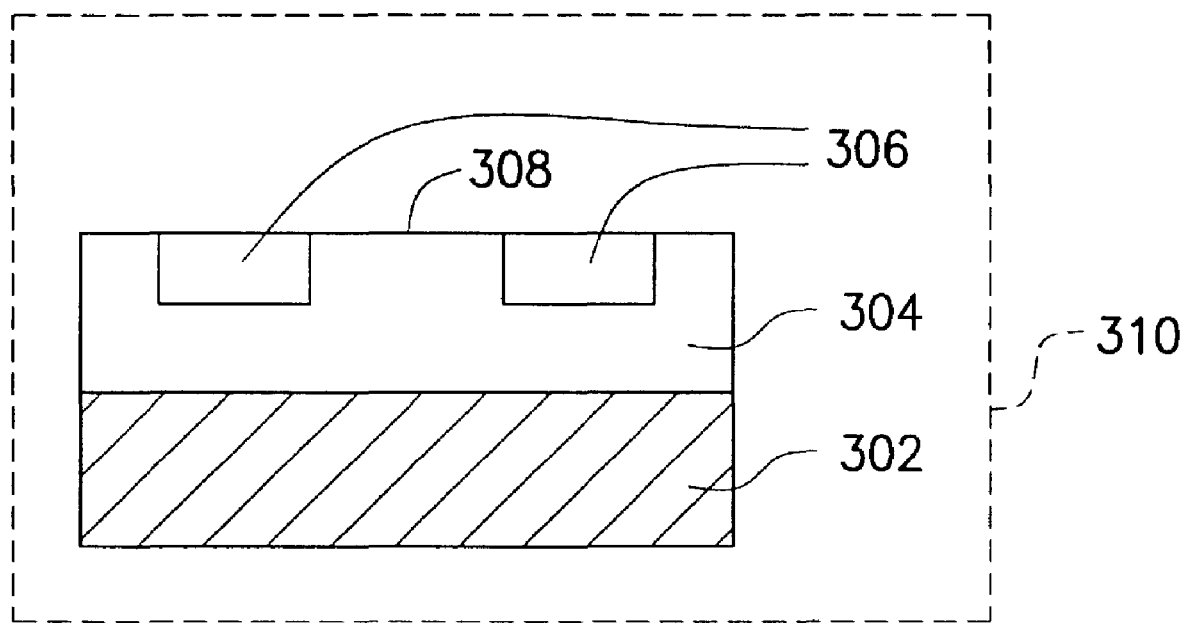
FIG. 3 illustrates a structure of the EUV mask according to one preferred embodiment of this invention.
Figure 4:
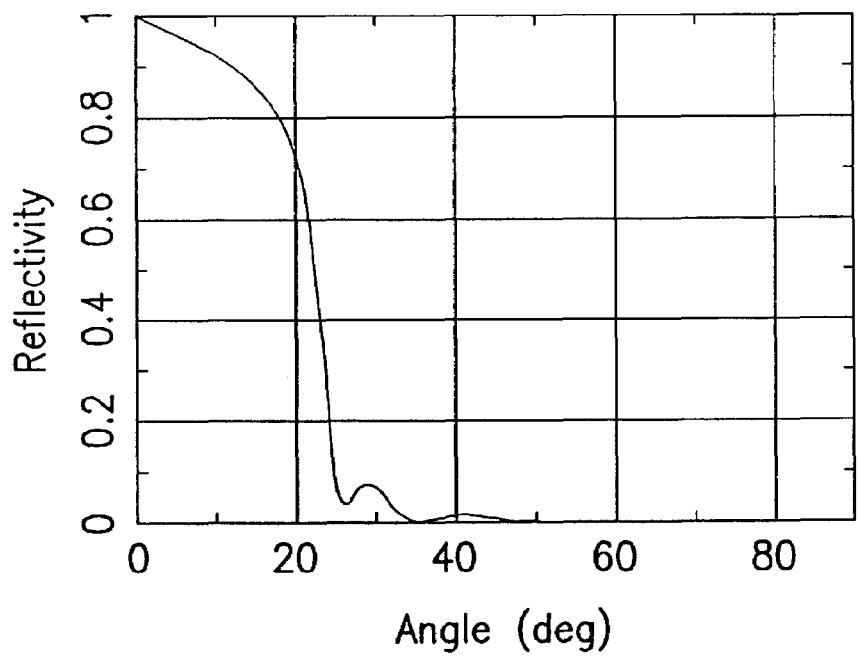
FIG. 4 illustrates a graph of reflectivity of molybdenum related to incident angle at a wavelength 13.2 nm of the incident EUV.
Figure 5:
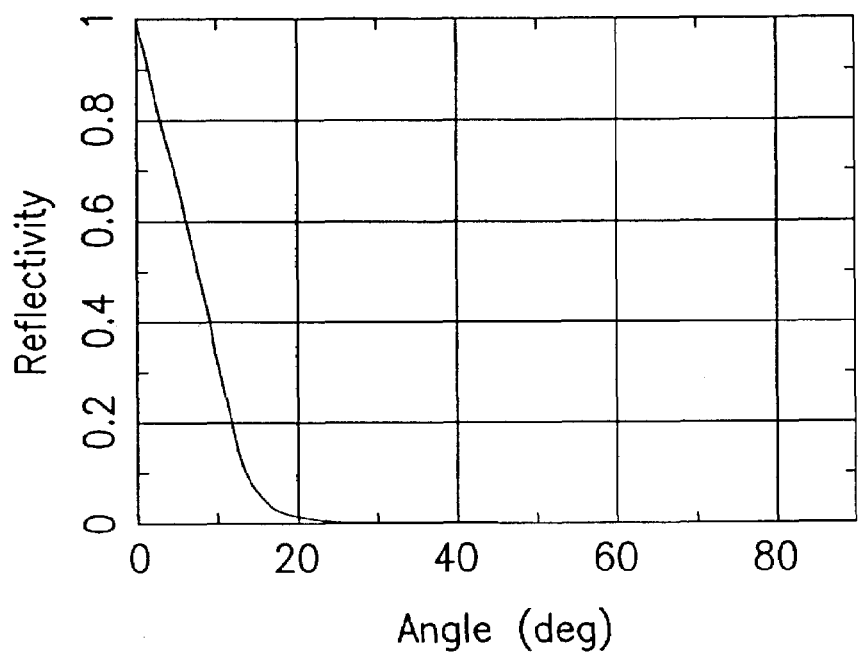
FIG. 5 illustrates a graph of reflectivity of silicon oxide related to incident angle at a wavelength 13.2 nm of the incident EUV.

In this invention an improved EUV mask is used for developing the patterns to the wafers in an improved EUV lithography process. FIG. 3 illustrates a structure of an EUV mask of a preferred embodiment of this invention. The EUV mask 310 in FIG. 3 includes a silicon or glass substrate 302 and an absorbing layer 304 for absorbing an incident EUV is formed on the substrate 302. The surface of the absorbing layer 304 being opposite to the substrate 302 includes a portion of reflective regions 306 and the other portion of absorbing regions 308. The reflective regions 306 are formed by etching a portion of the regions near the surface of the absorbing layer 304 and replacing these regions by materials with high reflectivity. The absorbing layer 304 and the absorbing regions 308 are made of high-absorption material (material with absorption in a range of about 80% to about 99% referring to a specific incident EUV wavelength and a specific incident angle), such as silicon oxide in a preferred embodiment. In another alternative embodiment the absorbing layer 304 and the absorbing regions 308 can also be made of silicon carbide, silicon nitride, or aluminum. The reflective region 306, which is a single layered reflective layer, is made of high-reflectivity material (material with reflectivity in a range of about 70% to about 99% referring to a specific incident EUV wavelength and a specific incident angle), such as molybdenum in a preferred embodiment. In another alternative embodiment the reflective regions 306 can also be made of titanium, vanadium, or copper. FIG. 4 illustrates the reflectivity of molybdenum related to incident angle at a wavelength 13.2 nm of the incident EUV, and FIG. 5 illustrates the reflectivity of silicon oxide related to incident angle at a wavelength 13.2 nm of the incident EUV. At the wavelength 13.2 nm of the incident EUV, molybdenum and silicon oxide are suitable for fabricating the EUV mask 310 at a grazing incident angle in a region of about 15 degree to about 20 degree in a preferred embodiment.

Figure 6:
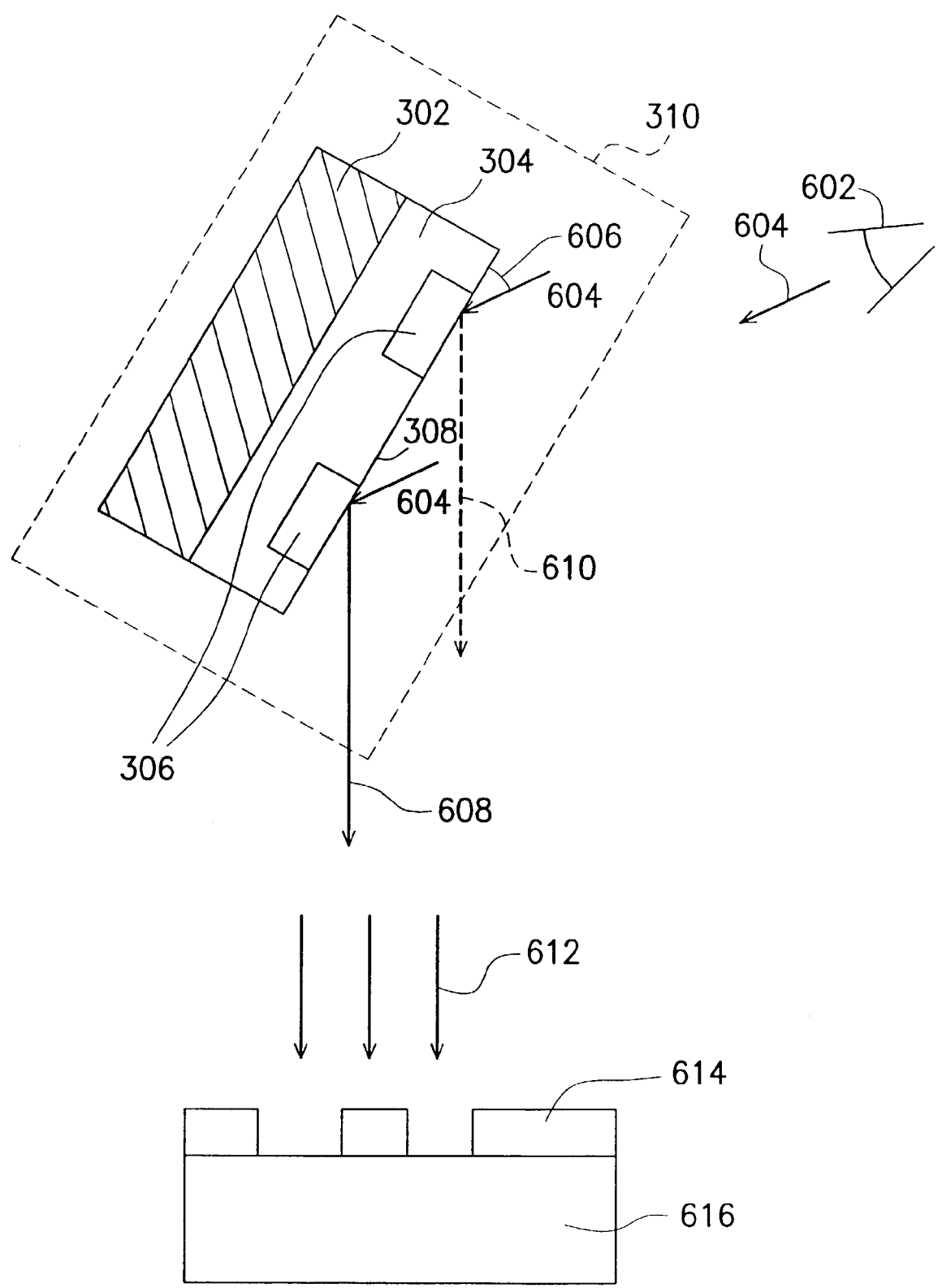
FIG. 6 illustrates a process of EUV lithography according to one preferred embodiment of this invention.

FIG. 6 illustrates the process of EUV lithography of a preferred embodiment of the invention. In FIG. 6 an incident EUV 604 emitted from an EUV source 602 irradiates on the surface of the EUV mask 310 at an incident angle 606. The incident angle 606 is the angle between the incident direction of the incident EUV 604 and the surface of the EUV mask 310. A portion of the incident EUV 604 irradiating on the reflective regions 306 is reflected with high reflectivity in a range of about 70% to about 99%, and the other portion of the incident EUV 604 irradiating on the absorbing regions 308 is absorbed with high absorption in a range of about 80% to about 99%. Therefore, about 70% to about 99% of the incident EUV 604 is transferred into a highly-reflected EUV 608 and about 20% to about 1% of the incident EUV 604 is transferred into a lowly-reflected EUV 610. The reflected EUV 612 including the highly-reflected EUV 608 and the lowly-reflected EUV 610 is transmitted onto the photo resist layer 614 on the surface of the wafer 616. Therefore, the patterns on the surface of the EUV mask 310 are developed to the surface of the wafer 616 by the highly-reflected EUV 608.

In order to achieve high reflectivity on the surface of the EUV mask 310, the incident angle 606 is set in a range of about 5 degree to about 40 degree, that means the incident of the EUV is grazing incident. Even though the thickness of the absorbing layer 304 is tightly controlled to be within their target thickness ±0.1 nm, and the surface roughness of the EUV mask 310 is tightly controlled to be within its target thickness ±0.1 nm, the fabrication of the EUV mask 310 is much easier than the fabrication of the multilayer mask 110 in the prior art. Since only a few layers are formed in the EUV mask 310, the surface roughness and the defects are easily controlled in comparison with the prior art. The final reflectivity of the surface of the EUV mask 310 is easily controlled to be in a range of about 70% to about 80%. The improved EUV lithographic process is efficiently and cheap.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A reflection mask comprising:
   a substrate;
   a plurality of single-layered reflective regions on the surface of the reflection mask being opposite to the substrate, for reflecting an incident extreme ultraviolet (EUV) with high reflectivity at a grazing incident angle, wherein the grazing incident angle is an angle between a incident direction of the incident EUV and the surface of the reflection mask, and wherein the grazing incident angle is in a range of about 5 degree to about 40 degree; and
   a plurality of absorbing regions on the surface of the reflection mask being opposite to the substrate, for absorbing the incident EUV with high absorption at the grazing incident angle, wherein the top surface of each single-layered reflective region and the top surface of each absorbing region are coplanar.

2. The reflection mask of claim 1, wherein the wavelength of the incident EUV is in a range of about 5 nm to about 50 nm.

3. The reflection mask of claim 1, wherein the reflectivity of the single-layered reflective regions is in a range of about 70% to about 99%.

4. The reflection mask of claim 1, wherein the component materials of the single-layered reflective regions comprise: molybdenum, titanium, vanadium or copper.

5. The reflection mask of claim 1, wherein the absorption of the absorbing regions is in a range of about 80% to about 99%.

6. The reflection mask of claim 1, wherein the component materials of the absorbing regions comprise: silicon oxide, silicon carbide, silicon nitride or aluminum.

7. A process of lithography comprising the steps of:
   transmitting an incident EUV onto a reflection mask at a grazing incident angle, wherein the grazing incident angle is an angle between a incident direction of the incident EUV and the surface of the reflection mask, wherein the gazing incident angle is in a range of about 5 degree to about 40 degree, thereon the surface of the reflection mask comprises two pluralities of regions in which one is a plurality of single-layered reflective regions and the other is a plurality of absorbing regions, wherein a part of the incident BUy that irradiates on the plurality of single-layered reflective regions is reflected with high reflectivity and transferred into a highly reflected EUV, and the other part of the incident EUV that irradiates on the plurality of absorbing regions is reflected with low reflectivity and transferred into a lowly reflected EUV; and
   developing a pattern image by the highly reflected EUV and lowly reflected EUV to a photo resist layer on the surface of the wafer, wherein the shape of the pattern image is dependent on the shape of the plurality of single-layered reflective regions on the surface of the reflection mask.

8. The process of lithography of claim 7, wherein the wavelength of the incident EUV is in a range of about 5 nm to about 50 nm.

9. The process of lithography of claim 7, wherein the reflectivity of the single-layered reflective regions is in a range of about 70% to about 99%.

10. The process of lithography of claim 7, wherein the component materials of the single-layered reflective regions comprise: molybdenum, titanium, vanadium or copper.

11. The process of lithography of claim 7, wherein the absorption of the absorbing regions is in a range of about 80% to about 99%.

12. The process of lithography of claim 7, wherein the component materials of the absorbing regions comprise: silicon oxide, silicon carbide, silicon nitride or aluminum.

13. An extreme ultraviolet reflection mask comprising:
a substrate;
an absorbing layer located over the substrate, wherein the absorbing layer has a plurality of recessions at the top surface of the absorbing layer; and
a plurality of reflective objects, for reflecting an incident extreme ultraviolet, filling up the recessions respectively, wherein the top surfaces of the reflective objects and the top surface of the absorbing layer are coplanar.

14. The reflection mask of claim 13, wherein the wavelength of the incident extreme ultraviolet is in a range of about 5 nm to about 50 nm.

15. The reflection mask of claim 13, wherein the reflectivity of each reflective object is in a range of about 70%~99%.

16. The reflection mask of claim 13, wherein the material of each reflective object is selected from a group consisting of molybdenum, titanium, vanadium and copper.

17. The reflection mask of claim 13, wherein the absorption of the absorbing layer is in a range of about 80%~99%.

18. The reflection mask of claim 13, wherein the materials of the absorbing layer is selected from a group consisting of silicon oxide, silicon carbide, silicon nitride and alununum.

19. The reflection mask of claim 13, wherein the incident extreme ultraviolet is incident to each reflective object with a grazing incident angle and the grazing incident angle of about 5 degree to about 40 degree is an angle between a incident direction of the incident extreme ultraviolet and the surface of the reflection mask.

* * * * *